July 2, 1963 F. R. SANTOS 3,096,489

TUNING FORK TONE GENERATOR

Filed Nov. 14, 1960

INVENTOR.
FREDERICO RIBEIRO SANTOS
BY
Woodhams, Blanchard and Flynn
ATTORNEYS

United States Patent Office 3,096,489

Patented July 2, 1963

3,096,489

TUNING FORK TONE GENERATOR

Frederico R. Santos, Rua Antonio de Godoi 35, Sao Paulo, Brazil

Filed Nov. 14, 1960, Ser. No. 68,939
Claims priority, application Brazil Nov. 14, 1959
4 Claims. (Cl. 331—51)

This invention relates to a tone generator for an organ or similar musical instrument. This tone generator is comprised of a tuning fork connected to a suitable electronic circuit. This circuit receives the impulses of certain frequencies generated by the tuning fork, amplifies the primary wave forms, and divides the frequencies.

The tuning fork may also furnish directly the frequencies to be amplified individually to electronic circuits.

The invention is diagrammatically illustrated, by way of example, in the accompanying drawings, in which.

Figure 1:
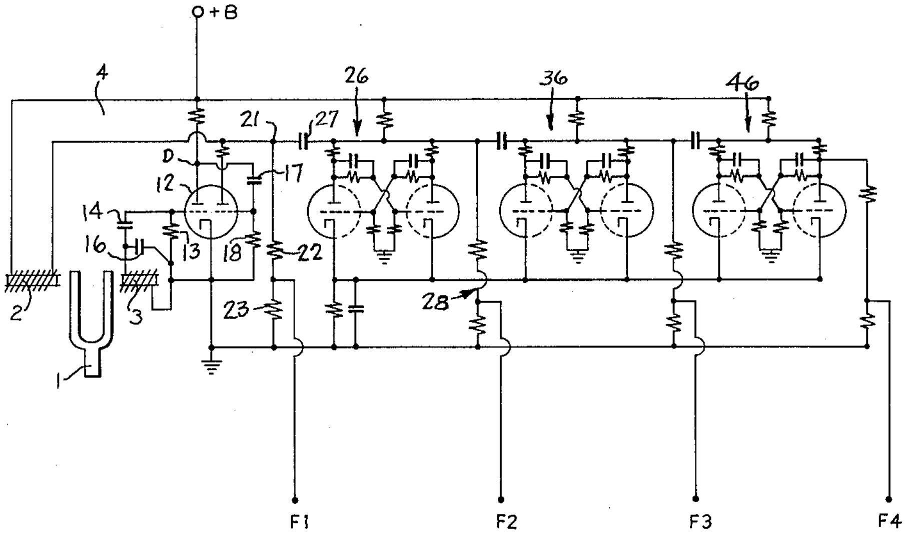
FIGURE 1 is a circuit diagram of the circuit to which the invention relates.
Figure 2:
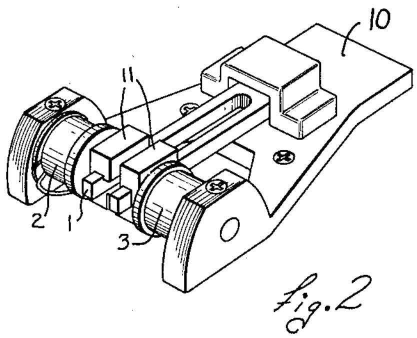
FIGURES 2 is a perspective view of the tuning fork assembly.

Referring to the drawings, FIGURE 2 shows the tuning fork assembly in which a tuning fork 1 is mounted on a base 10 and the prongs of said tuning fork have weights 11 thereon. A driving coil 2 and a pick-up coil 3 are supported on the base 10 and are positioned close to the free ends of the prongs of the tuning fork.

The driving coil 2 is connected at one end of a B+ terminal and is connected at the other end to the right-hand plate of a dual triode 12. When the current is turned on, the build up of current through the dual triode 12 produces a magnetic fluctuation of coil 2 and this fluctuation causes the tuning fork to vibrate. This will cause current flow to be induced in pick-up coil 3. Pick-up coil 3 is resistance-capacitance coupled, by resistance 13 and capacitance 14, to the left-hand grid of the dual triode 12. Capacitor 16, which is connected in parallel with the coil 3, tunes said coil to the fork frequency to increase the efficiency of the tuning fork oscillator.

The amplified signal from the left-hand portion of dual triode 12 will appear at point D and this signal is impressed on the right-hand control electrode of the dual triode through the capacitor 17. Resistance 18 is a grid leak resistance. The signal now appears at the right-hand plate of the dual triode 12 and, since the driving coil 2 is a load for this plate, it will provide a strong magnetic fluctuation in coil 2. Thus, the tuning fork continuously vibrates at its selected frequency.

The right-hand plate of the dual triode 12 also is connected to a point 21. A voltage divider circuit comprising series connected resistances 22 and 23 is connected to point 21. A first frequency output terminal $F_1$ is connected to a point between said resistances.

A frequency dividing network 26 is connected through a coupling capacitor 27 to the point 21. The frequency dividing network 26 shown to illustrate the invention is a plate-to-grid coupled bistable multivibrator and since the construction and operation of such multivibrators are well known a detailed disclosure thereof is believed unnecessary. Other types of frequency dividing networks could be used if desired. The incoming signal from point 21 is injected into the network 26 and the network produces an outgoing signal of half the frequency of the incoming signal. This outgoing signal is supplied to a second frequency output terminal $F_2$ from a tap on the voltage divider 28.

The outgoing signal from network 26 also is supplied to a further frequency dividing network 36 and thence to another frequency dividing network 46 each of which may be identical with network 26. These networks each divide the signal and supply additional output signals to the terminals $F_3$ and $F_4$. Additional frequency dividing networks could be provided if desired.

As has already been pointed out, the tuning fork can also furnish a signal of the desired frequency directly to individual electronic amplifier circuits. In this case, the frequency divider circuits are dispensed with, and as many basic tuning fork-amplifier circuits are used as may be required for obtaining the specified or desired frequencies.

I claim:

1. A tuning fork oscillator adapted to serve as a tone generator for an organ, comprising:
   - a tuning fork having a pair of prongs;
   - a driving coil adjacent one prong and a pick-up coil adjacent the other prong;
   - a source of D.C. potential;
   - a first electric valve and means connecting the anode of said first valve directly to one end of said driving coil;
   - means connecting the other end of said driving coil directly to the positive terminal of said source;
   - means connecting the cathode of said first valve to ground whereby energization of said driving coil is controlled directly by the conduction of said first valve;
   - a second electric valve having its anode coupled to the control electrode of said first valve and also connected to the positive terminal of said source, the cathode of said second valve being connected to ground;
   - means connecting said pick-up coil between said cathode and the control electrode of said second valve; and
   - means connected to said first valve for providing a frequency output corresponding to the frequency of said tuning fork.

2. A tuning fork oscillator according to claim 1 including a capacitor connected in parallel with said pickup coil.

3. A tuning fork oscillator according to claim 1 including a frequency dividing network coupled with a principal electrode of said valve for receiving a signal therefrom and dividing the frequency of same so that the frequency of the output signal of said frequency dividing network is a predetermined fraction of the frequency of the output signal of said valve.

4. A tuning fork oscillator according to claim 1 wherein a plurality of frequency dividing networks are connected in series with each other and the first network is coupled with a principal electrode of said valve, each of said frequency dividing networks being a bistable multivibrator and providing an output whose frequency is a predetermined fraction of the frequency of the input thereto, the input to each network being derived from the output of the next preceding network in said series; and
   - a voltage divider connected to each network for receiving the output therefrom and tap means for taking an output signal from each of said voltage dividers.

References Cited in the file of this patent

UNITED STATES PATENTS

| | | |
|---|---|---|
| 375,654 | Seagrove | Dec. 27, 1887 |
| 1,637,442 | Dorsey | Aug. 2, 1927 |
| 2,540,727 | Hanert | Feb. 6, 1951 |
| 2,675,475 | Trousdale | Apr. 13, 1954 |
| 2,996,685 | Lawrence | Aug. 15, 1961 |
| 2,998,576 | Cannon | Aug. 29, 1961 |